(12) United States Patent
Wu et al.

(10) Patent No.: US 11,764,530 B2
(45) Date of Patent: Sep. 19, 2023

(54) CIRCUIT BOARD DEVICE AND FIXING MEMBER THEREOF

(71) Applicant: Wistron Corporation, New Taipei (TW)

(72) Inventors: Long-Hua Wu, New Taipei (TW); Chi-Ken Tsai, New Taipei (TW)

(73) Assignee: Wistron Corporation, New Taipei (TW)

( * ) Notice: Subject to any disclaimer, the term of this patent is extended or adjusted under 35 U.S.C. 154(b) by 166 days.

(21) Appl. No.: 17/525,986

(22) Filed: Nov. 15, 2021

(65) Prior Publication Data
US 2023/0064895 A1    Mar. 2, 2023

(30) Foreign Application Priority Data

Aug. 25, 2021  (CN) .......................... 202122019474.9

(51) Int. Cl.
| | | |
|---|---|---|
| H01R 12/00 | (2006.01) | |
| H01R 33/97 | (2006.01) | |
| H05K 1/18 | (2006.01) | |
| H01R 12/73 | (2011.01) | |
| H01R 12/70 | (2011.01) | |

(52) U.S. Cl.
CPC ......... *H01R 33/97* (2013.01); *H01R 12/7076* (2013.01); *H01R 12/73* (2013.01); *H05K 1/181* (2013.01); *H05K 2201/09063* (2013.01); *H05K 2201/10189* (2013.01); *H05K 2201/10545* (2013.01)

(58) Field of Classification Search
CPC ..... H01R 33/97; H01R 12/7076; H01R 12/73
See application file for complete search history.

(56) References Cited

U.S. PATENT DOCUMENTS

| | | | | |
|---|---|---|---|---|
| 7,077,678 B1* | 7/2006 | Korsunsky | ......... | H01R 12/7005 439/328 |
| 7,172,432 B2* | 2/2007 | Campini | .............. | H05K 7/1461 439/74 |
| 7,300,298 B2* | 11/2007 | Kameda | ................. | H01R 12/83 439/326 |
| 7,583,514 B2* | 9/2009 | Zuo | ....................... | G06K 13/085 361/801 |
| 7,682,179 B1* | 3/2010 | Tsai | ................... | H01R 12/7005 439/328 |
| 8,500,461 B2* | 8/2013 | Tseng | ..................... | H05K 3/325 439/74 |
| 8,608,501 B2* | 12/2013 | Sun | .................... | H01R 12/7029 439/326 |

* cited by examiner

*Primary Examiner* — Neil Abrams
(74) *Attorney, Agent, or Firm* — Winston Hsu

(57) ABSTRACT

A circuit board device includes a fixing member and a circuit board having a first hole. The fixing member includes a base having a second positioning portion and an opening, a first fixing component and a pillar structure having a first pillar body and a positioning pillar extending downward from the first pillar body and having a first positioning portion and a clamping portion. The clamping portion clamps the circuit board with the first pillar body when the first positioning portion is engaged with the first hole. The base is disposed in the first hole and abuts against the positioning pillar when the second positioning portion hooks the first hole and the opening is engaged with the positioning pillar. The first fixing component is detachably inserted into the pillar structure for clamping a first interface card with the first pillar body.

20 Claims, 9 Drawing Sheets

CIRCUIT BOARD DEVICE AND FIXING MEMBER THEREOF

BACKGROUND OF THE INVENTION

1. Field of the Invention

The present disclosure relates to a circuit board device and a fixing member thereof, and more specifically, to a circuit board device for mounting of interface cards with different lengths and a fixing member thereof.

2. Description of the Prior Art

In general, an interface card (e.g., M.2 interface card) is mounted on a circuit board by screws or plastic hook pillars. The aforesaid screw locking design involves locking screws into screw pillars for fixing the interface card on the circuit board after the screw pillars are mounted into preset holes on the circuit board. In this condition, if a user wants to replace the interface card with another interface card having a different length, the user needs to utilize a Phillips screw driver to detach the screws and then utilize a hexagon socket to detach the screw pillars. During the aforesaid process, it may easily cause the unintentional detachment problem that the screw pillar is detached together with the screw.

Furthermore, in the aforesaid hook pillar fixing design, the user needs to insert the plastic hook pillar into a mounting hole on the circuit board. However, since the plastic hook pillar additionally occupies space under the circuit board, it may cause the problem that the circuit board and another circuit board cannot be disposed in a stacked arrangement, so as to limit the mounting configuration and space utilization of the circuit board.

SUMMARY OF THE INVENTION

The present disclosure provides a circuit board device suitable for mounting of a first interface card. The circuit board device includes a circuit board and a fixing member. The circuit board has a first socket for connection of the first interface card and has a first hole. The first hole has a first position end portion and a second positioning end portion. The fixing member includes a pillar structure, a base, and a first fixing component. The pillar structure has a first pillar body, a positioning pillar, and a first axial hole formed on the pillar structure. The positioning pillar extends downward from the first pillar body and has a first positioning portion and a clamping portion corresponding to the first positioning end portion. The clamping portion clamps the circuit board cooperatively with the first pillar body when the positioning pillar is disposed in the first hole and the first positioning portion is engaged with the first positioning end portion. The base has at least one second positioning portion and an opening. The base is disposed in the first hole and abuts against the positioning pillar to make the pillar structure fixed in the first hole when the second positioning portion is engaged with the second positioning end portion of the first hole and the opening is engaged with the positioning pillar. The first fixing component is detachably inserted into the first axial hole to clamp the first interface card cooperatively with the first pillar body.

The present disclosure further provides a fixing member suitable for being mounted on a circuit board to fix a first interface card. The circuit board has a first socket for connection of the first interface card and has a first hole. The first hole has a first position end portion and a second positioning end portion. The fixing member includes a pillar structure, a base, and a first fixing component. The pillar structure has a first pillar body, a positioning pillar, and a first axial hole formed on the pillar structure. The positioning pillar extends downward from the first pillar body and has a first positioning portion and a clamping portion corresponding to the first positioning end portion. The clamping portion clamps the circuit board cooperatively with the first pillar body when the positioning pillar is disposed in the first hole and the first positioning portion is engaged with the first positioning end portion. The base has at least one second positioning portion and an opening. The base is disposed in the first hole and abuts against the positioning pillar to make the pillar structure fixed in the first hole when the second positioning portion is engaged with the second positioning end portion of the first hole and the opening is engaged with the positioning pillar. The first fixing component is detachably inserted into the first axial hole to clamp the first interface card cooperatively with the first pillar body.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
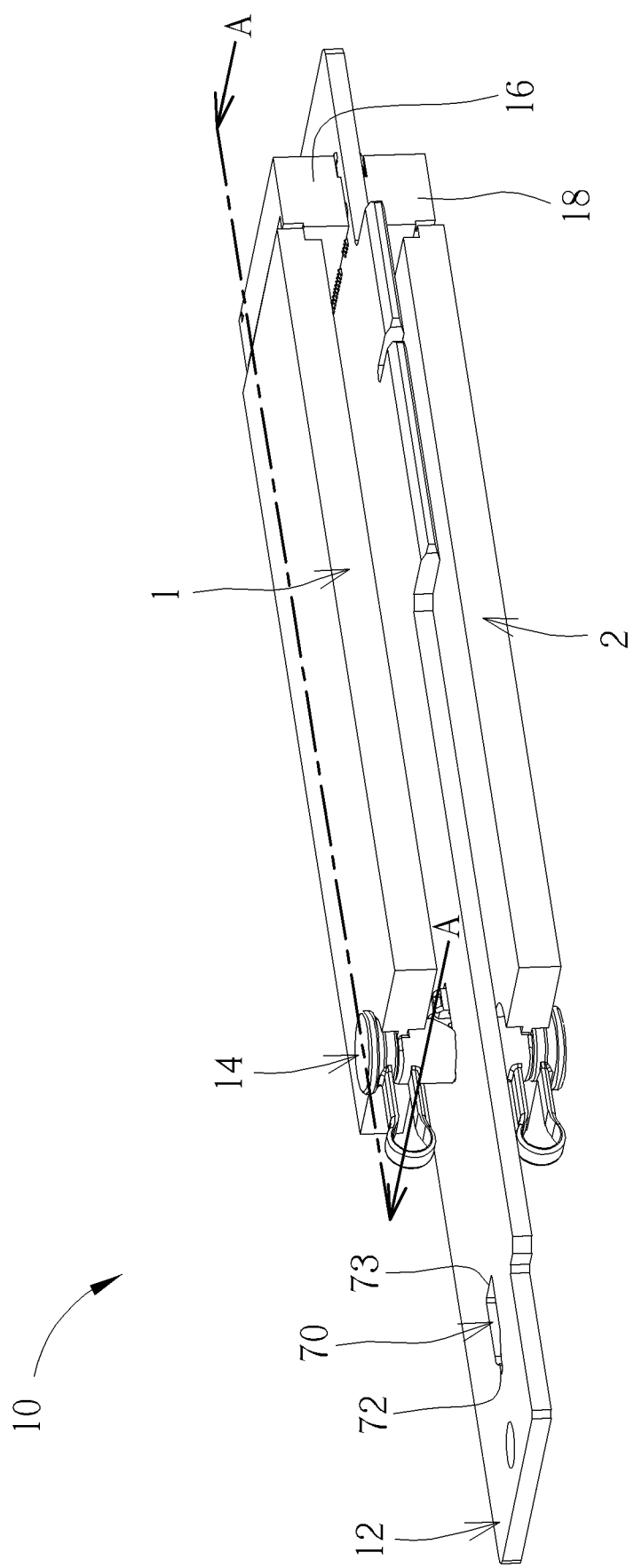
FIG. 1 is an assembly diagram of a circuit board device according to an embodiment of the present disclosure.
Figure 2:
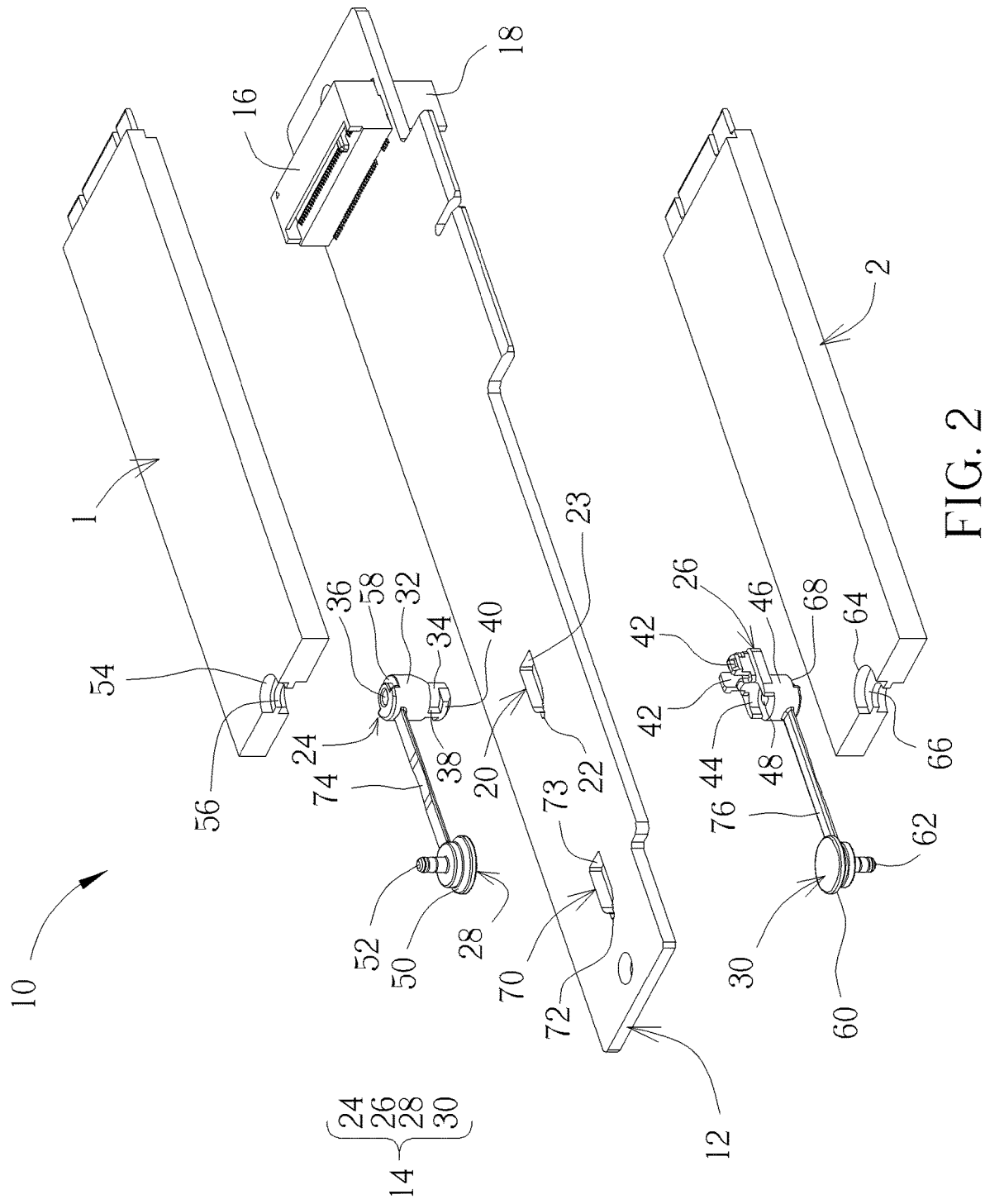
FIG. 2 is an exploded diagram of the circuit board device in FIG. 1.
Figure 3:
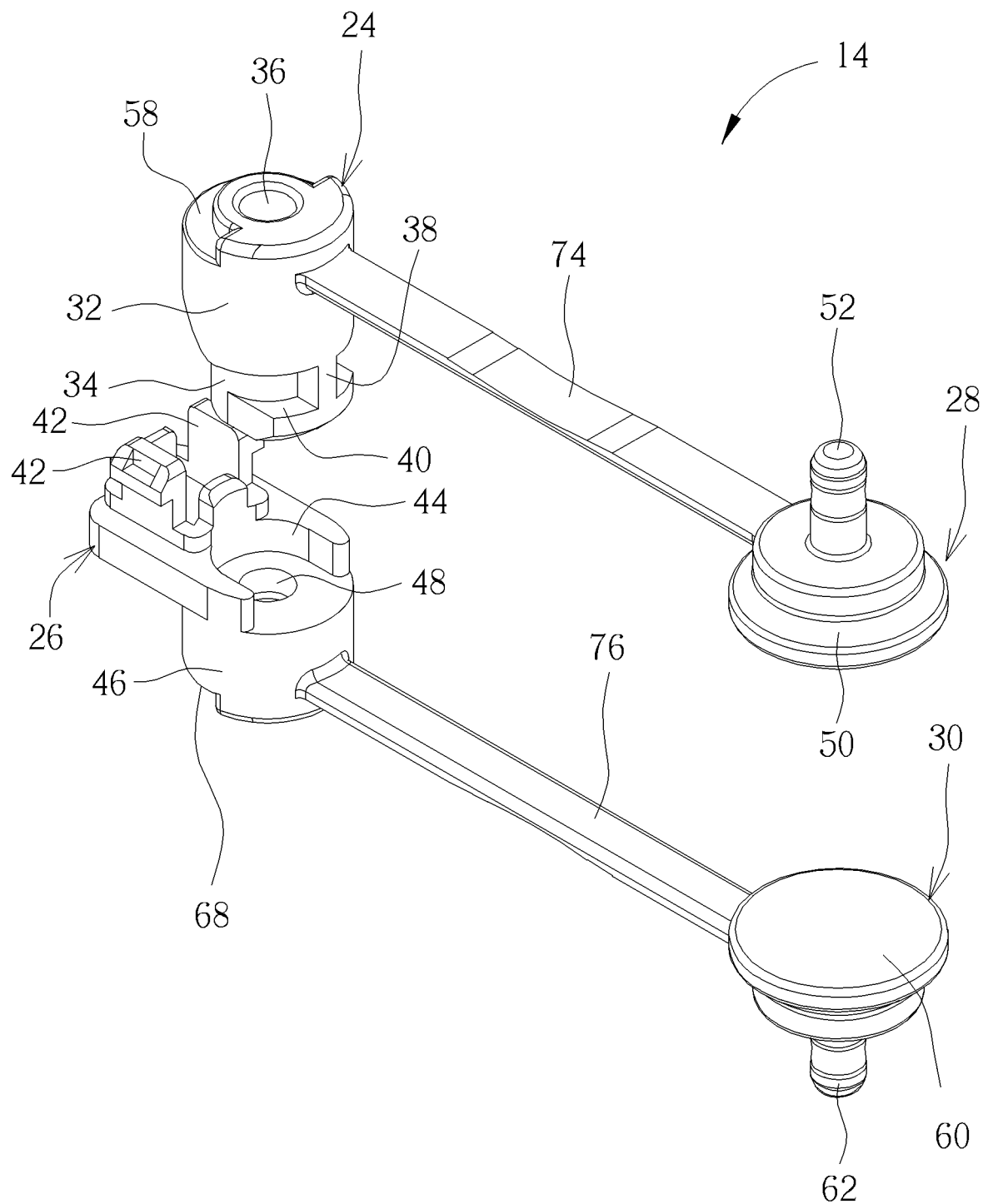
FIG. 3 is an enlarged diagram of a fixing member in FIG. 1 at another viewing angle.
Figure 4:
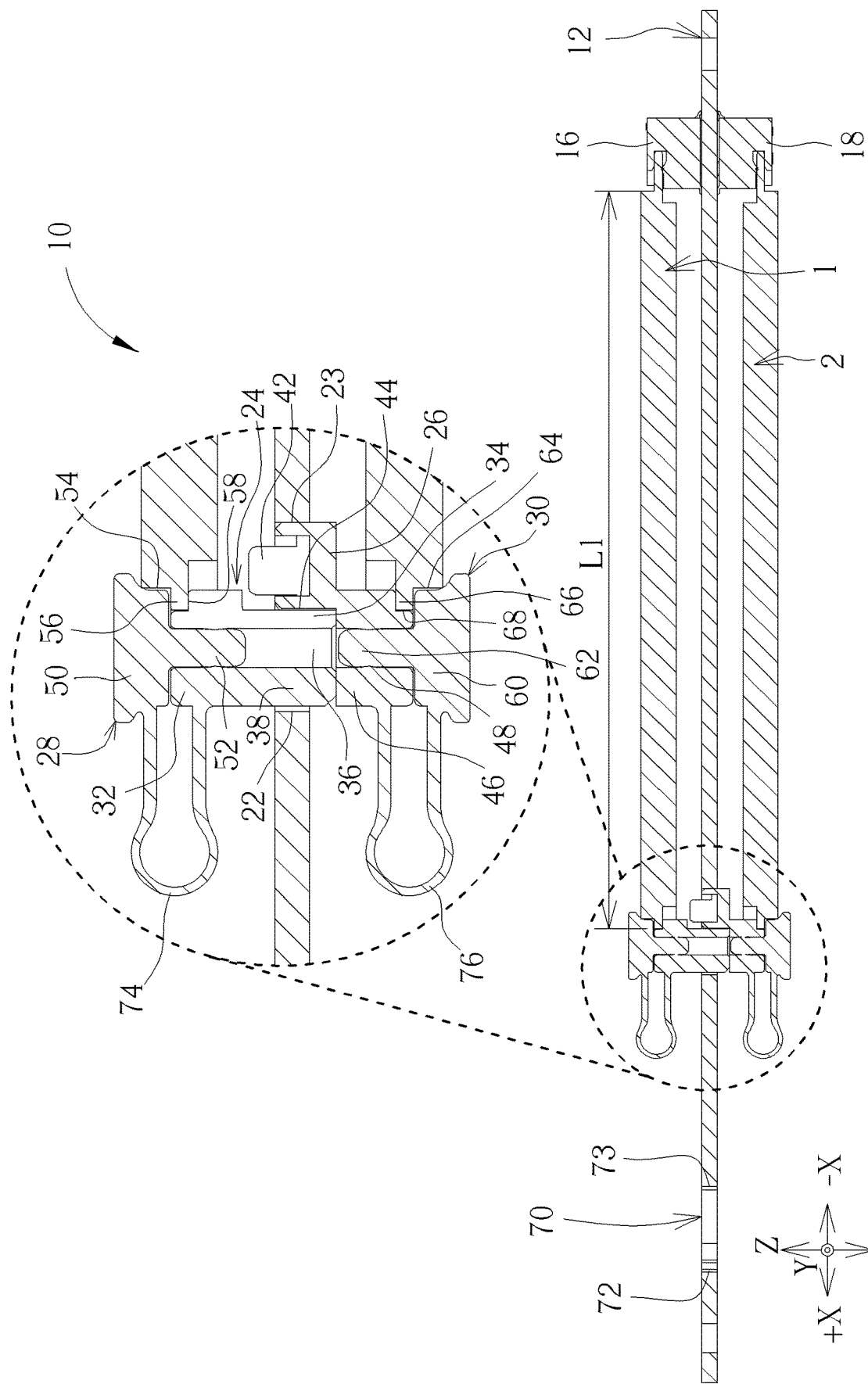
FIG. 4 is a cross-sectional diagram of the circuit board device in FIG. 1 along a cross-sectional line A-A.

Please refer to FIG. 1, FIG. 2, FIG. 3, and FIG. 4. FIG. 1 is an assembly diagram of a circuit board device 10 according to an embodiment of the present disclosure. FIG. 2 is an exploded diagram of the circuit board device 10 in FIG. 1. FIG. 3 is an enlarged diagram of a fixing member 14 in FIG. 1 at another viewing angle. FIG. 4 is a cross-sectional diagram of the circuit board device 10 in FIG. 1 along a cross-sectional line A-A.

As shown in FIGS. 1-4, the circuit board device 10 includes a circuit board 12 and the fixing member 14 (preferably made of plastic material, but the present disclosure is not limited thereto). The circuit board 12 could be preferably applied to a desktop computer or a mainboard of a server, but the present disclosure is not limited thereto. The circuit board 12 has a first socket 16 and a second socket 18 disposed at upper and bottom sides of the circuit board 12 respectively for mounting of a first interface card 1 and a second interface card 2 (e.g., M.2 interface card, but the present disclosure is not limited thereto). When the first interface card 1 and the second interface card 2 are inserted into the first socket 16 and the second socket 18 respectively, the first interface card 1 and the second interface card 2 can have a first mounting length L1 relative to the circuit board 12. The circuit board 12 has a first hole 20 formed thereon corresponding to the first mounting length L1. The first hole 20 has a first positioning end portion 22 and a second positioning end portion 23. The second positioning end portion 23 could be preferably a square hole edge, but the present disclosure is not limited thereto, meaning that the second positioning end portion 23 could be a circular hole edge in another embodiment.

As shown in FIG. 2, FIG. 3, and FIG. 4, the fixing member 14 includes a pillar structure 24, a base 26, a first fixing component 28, and a second fixing component 30. The pillar structure 24 has a first pillar body 32, a positioning pillar 34, and a first axial hole 36. The positioning pillar 34 extends downward from the first pillar body 32 and has a first positioning portion 38 and a clamping portion 40 corresponding to the first positioning end portion 22. The base 26 has at least one second positioning portion 42 (two hooks shown in FIG. 3, but the present disclosure is not limited thereto) and an opening 44, and a second pillar body 46 extends downward from the base 26. The second pillar body 46 has a second axial hole 48 (preferably aligned with the first axial hole 36 in an axial direction, but the present disclosure is not limited thereto). In this embodiment, the first positioning portion 38 could be a protruding rib and the first positioning end portion 22 could be a notch fitted with the protruding rib (but the present disclosure is not limited thereto, which means the present disclosure could adopt the design that the first positioning portion 38 is a notch and the first positioning end portion 22 is a protruding rib in another embodiment).

Via the aforesaid design, when the positioning pillar 34 is disposed in the first hole 20 and the first positioning portion 38 is engaged with the first positioning end portion 22, the circuit board 12 is sandwiched between the clamping portion 40 and the first pillar body 32 . On the other hand, when the second positioning portion 42 is engaged with the second positioning end portion 23 of the first hole 20 and the opening 44 is engaged with the positioning pillar 34, the base 26 is disposed in the first hole 20 and abuts against the positioning pillar 34.

In such a manner, via the designs that the first positioning portion 38 is engaged with the first positioning end portion 22 and the circuit board 12 is sandwiched between the clamping portion 40 and the first pillar body 32, the fixing member 14 can constrain movement of the pillar structure 24 toward a +X-axis direction, ±Y-axis directions, and ±Z-axis directions. Furthermore, via the design that the second positioning portion 42 is engaged with the second positioning end portion 23 and the base 26 abuts against the positioning pillar 34, the fixing member 14 can constrain movement of the pillar structure 24 toward a −X-axis direction. As such, the three-axis positioning effect can be achieved, so as to make the pillar structure 24 fixed in the first hole 20 firmly for the subsequent interface card clamping operation.

After the pillar structure 24 is fixed in the first hole 20, the fixing member 14 can utilize the first fixing component 28 to be detachably inserted into the first axial hole 36 for clamping the first interface card 1 cooperatively with the first pillar body 32 when the first interface card 1 is inserted into the first socket 16. To be more specific, as shown in FIG. 2 and FIG. 4, in this embodiment, the first fixing component 28 has a head portion 50 and a pin 52. The first interface card 1 has a notch 54 corresponding to the fixing member 14. The notch 54 has an arc-shaped convex portion 56 protruding toward the first pillar body 32, and the pillar body 32 has an arc-shaped concave portion 58 corresponding to the arc-shaped convex portion 56. Accordingly, when the first interface card 1 is inserted into the first socket 16 and the pin 52 is inserted into the first axial hole 36, the arc-shaped concave portion 58 is fitted with the arc-shaped convex portion 56, and the head portion 50 clamps the arc-shaped convex portion 56 cooperatively with the first pillar body 32, so as to complete the operation of mounting the first interface card 1 on the circuit board 12.

Subsequently, the fixing member 14 can utilize the second fixing component 30 to be detachably inserted into the second axial hole 48 for clamping the second interface card 2 cooperatively with the second pillar body 46 when the second interface card 2 is inserted into the second socket 18. The aforesaid design that the first interface card 1 is fixed by the first fixing component 28 could be preferably applied to fixing the second interface card 2 by the second fixing component 30 (but the present disclosure is not limited thereto). That is, as shown in FIG. 2 and FIG. 4, in this embodiment, the second fixing component 30 has a head portion 60 and a pin 62, and the second interface card 2 has a notch 64 corresponding to the fixing member 14. The notch 64 has an arc-shaped convex portion 66 protruding toward the second pillar body 46, and the second pillar body 46 has an arc-shaped concave portion 68 corresponding to the arc-shaped convex portion 66. Accordingly, when the second interface card 2 is inserted into the second socket 18 and the pin 62 is inserted into the second axial hole 48, the arc-shaped concave portion 68 is fitted with the arc-shaped convex portion 66, and the head portion 60 clamps the arc-shaped convex portion 66 cooperatively with the second pillar body 46, so as to complete the operation of mounting the second interface card 2 on the circuit board 12. In such a manner, a user can mount the first interface card 1 and the second interface card 2 having the same mounting length on the upper side and the bottom side of the circuit board 12 respectively (as shown in FIG. 1).

On the other hand, when the user wants to detach the first interface card 1 and the second interface card 2 from the circuit board 12, the user just needs to push the head portion 50 of the first fixing component 28 and the head portion 60 of the second fixing component 30 and then pull out the pin 52 and the pin 62 from the first axial hole 36 and the second axial hole 48 respectively, so as to release the first interface card 1 from the first fixing component 28 and release the second interface card 2 from the second fixing component 30. As such, the user can detach the first interface card 1 and the second interface card 2 from the first socket 16 and the second socket 18 respectively, so as to complete the detachment operations of the first interface card 1 and the second interface card 2 conveniently and quickly.

Figure 5:
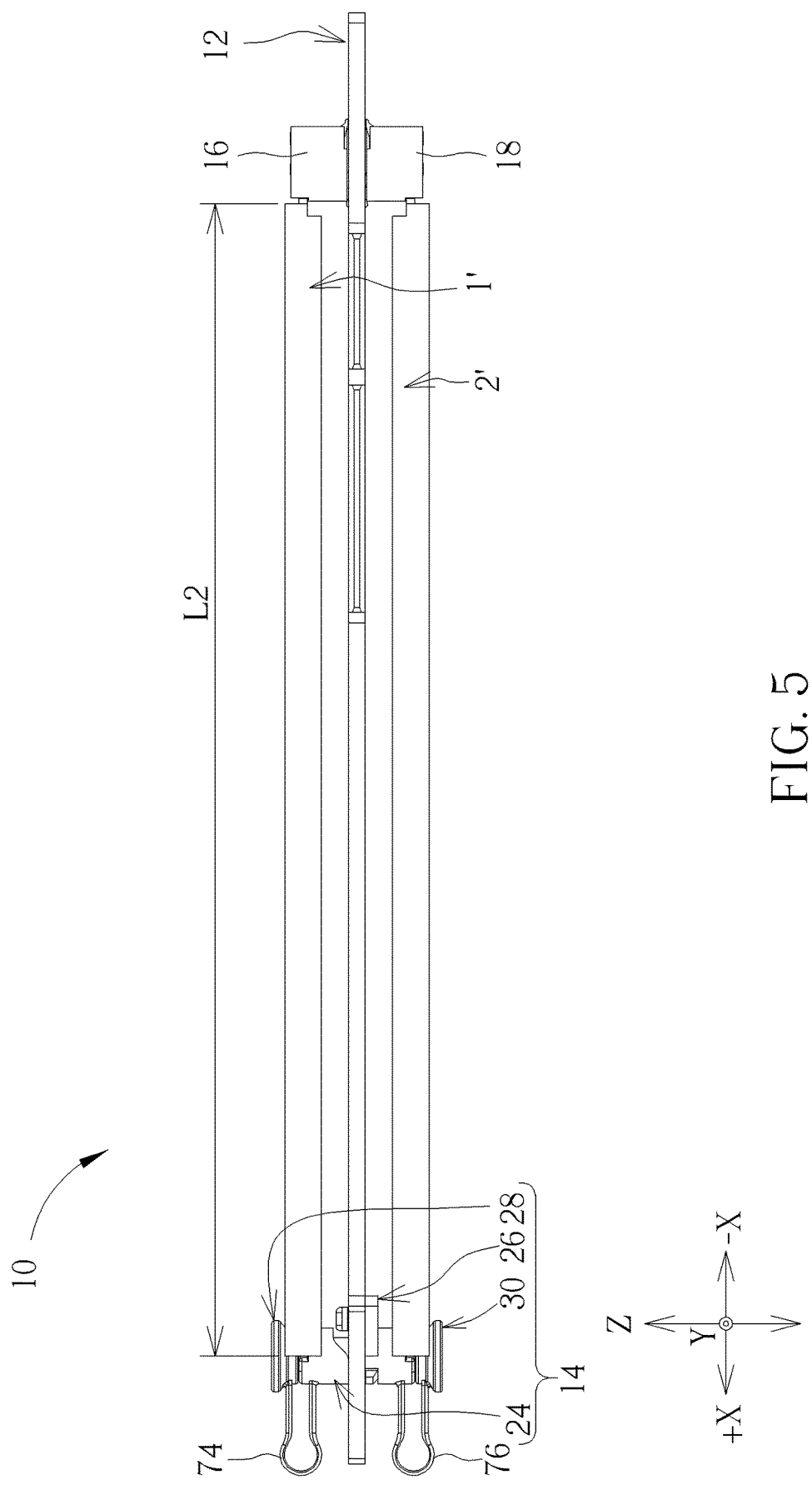
FIG. 5 is a side view of the circuit board device in FIG. 1 having a first interface card and a second interface card mounted thereon.

At this time, if the user wants to replace the first interface card 1 and the second interface card 2 with a first interface card 1' and a second interface card 2' having a longer mounting length, the user just needs to mount the fixing member 14 in the second hole 62 corresponding to the mounting length of the first interface card 1' and the second interface card 2' for the subsequent clamping operations of the first interface card 1' and the second interface card 2'. The related description for the mounting operations of the first interface card 1' and the second interface card 2' could refer to FIG. 2, FIG. 4, and FIG. 5. FIG. 5 is a side view of the circuit board device 10 in FIG. 1 having the first interface card 1' and the second interface card 2' mounted thereon. As shown in FIG. 2, FIG. 4, and FIG. 5, the first interface card 1' and the second interface card 2' have a second mounting length L2 (larger than the first mounting length L1) relative to the circuit board 12 when the first interface card 1' and the second interface card 2' are inserted into the first socket 16 and the second socket 18 respectively. The circuit board 12 has a second hole 70 corresponding to the second mounting length L2, and the second hole 70 has a third positioning end portion 72 and a fourth positioning end portion 73.

In brief, after the first interface card 1 and the second interface card 2 are detached from the circuit board 12, the user can push the second positioning portion 42 inward to be separate from the second positioning end portion 23 and then take the base 26 out of the first hole 20. Subsequently, the user can push the pillar structure 24 to disengage the first positioning portion 38 from the first positioning end portion 22, so as to complete the detachment operation of the fixing member 14.

Subsequently, via the designs that the first positioning portion 38 is engaged with the third positioning end portion 72 and the circuit board 12 is sandwiched between the clamping portion 40 and the first pillar body 32, the fixing member 14 can constrain movement of the pillar structure 24 toward the +X-axis direction, the ±Y-axis directions, and the ±Z-axis directions in the second hole 70. Furthermore, via the design that the second positioning portion 42 is engaged with the fourth positioning end portion 73 and the base 26 abuts against the positioning pillar 34, the fixing member 14 can constrain movement of the pillar structure 24 toward the −X-axis direction in the second hole 70. As such, the three-axis positioning effect can be achieved, so as to make the pillar structure 24 fixed in the second hole 70 firmly.

Finally, the fixing member 14 can utilize the first fixing component 28 to be detachably inserted into the first axial hole 36 for clamping the first interface card 1' cooperatively with the first pillar body 32 when the first interface card 1' is inserted into the first socket 16, and can utilize the second fixing component 30 to be detachably inserted into the second axial hole 48 for clamping the second interface card 2' cooperatively with the second pillar body 46 when the second interface card 2' is inserted into the second socket 18. The detailed description could be reasoned by analogy according to the aforesaid embodiments and omitted herein. In such a manner, the user can mount the first interface card 1' and the second interface card 2' having the longer mounting length (i.e. the second mounting length L2) on the upper side and the bottom side of the circuit board 12 respectively (as shown in FIG. 5).

In practical application, as shown in FIG. 2, the fixing member 14 could further include a connection strip 74 and a connection strip 76. The connection strip 74 is connected to the first fixing component 28 and the first pillar body 32, and the connection strip 76 is connected to the second fixing component 30 and the second pillar body 46, so as to surely prevent accidental loss of the first fixing component 28 and the second fixing component 30 during the aforesaid mounting and detachment processes.

In summary, compared with the prior art, the present disclosure adopts the two-piece fixing design that the pillar structure is fitted with the base and the clamping design that the fixing component is detachably engaged with the pillar structure, to allow that the user can complete the interface card mounting and replacing operations conveniently and quickly. In such a manner, since there is no need to adopt the screw locking design, the present disclosure can efficiently solve the unintentional detachment problem mentioned in the prior art and omit the time-consuming and strenuous screw locking process, so as to greatly improve mounting and replacing convenience of the circuit board device.

Figure 6:
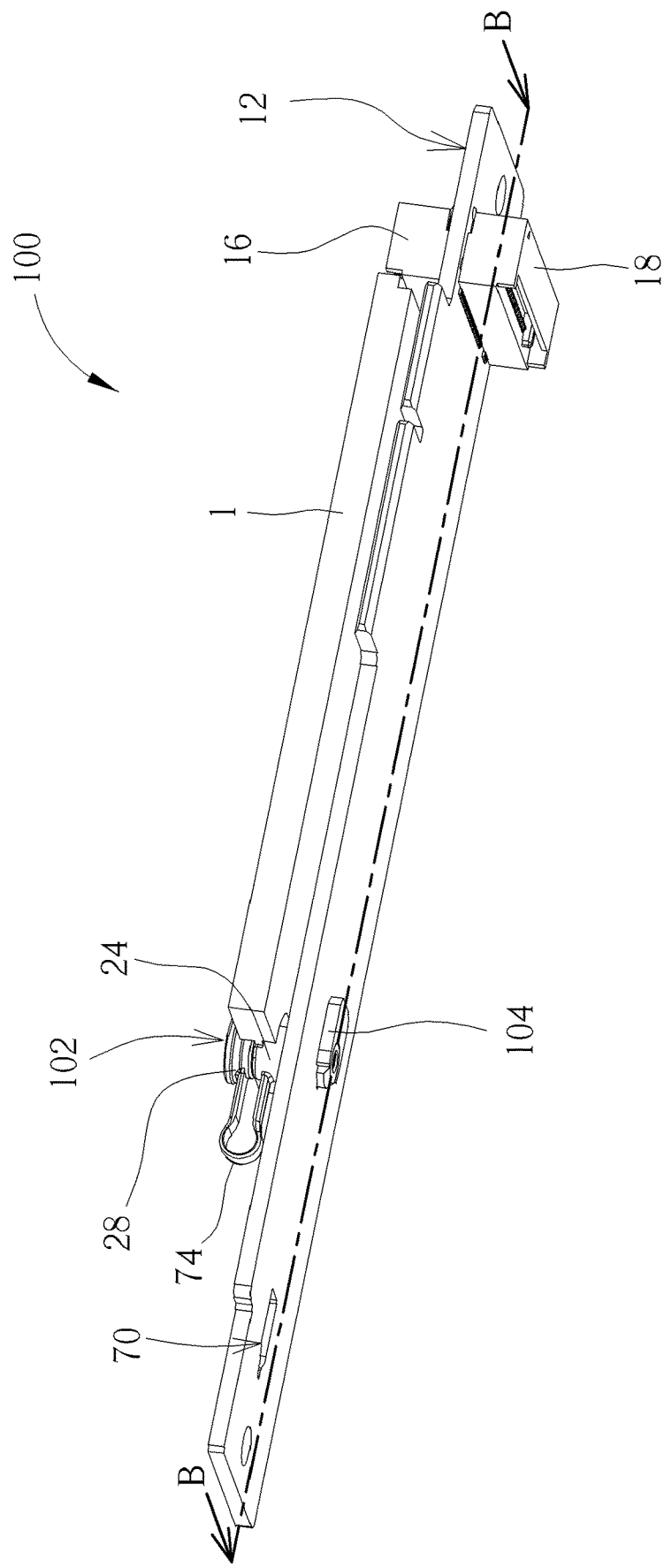
FIG. 6 is an assembly diagram of a circuit board device according to another embodiment of the present disclosure.
Figure 7:
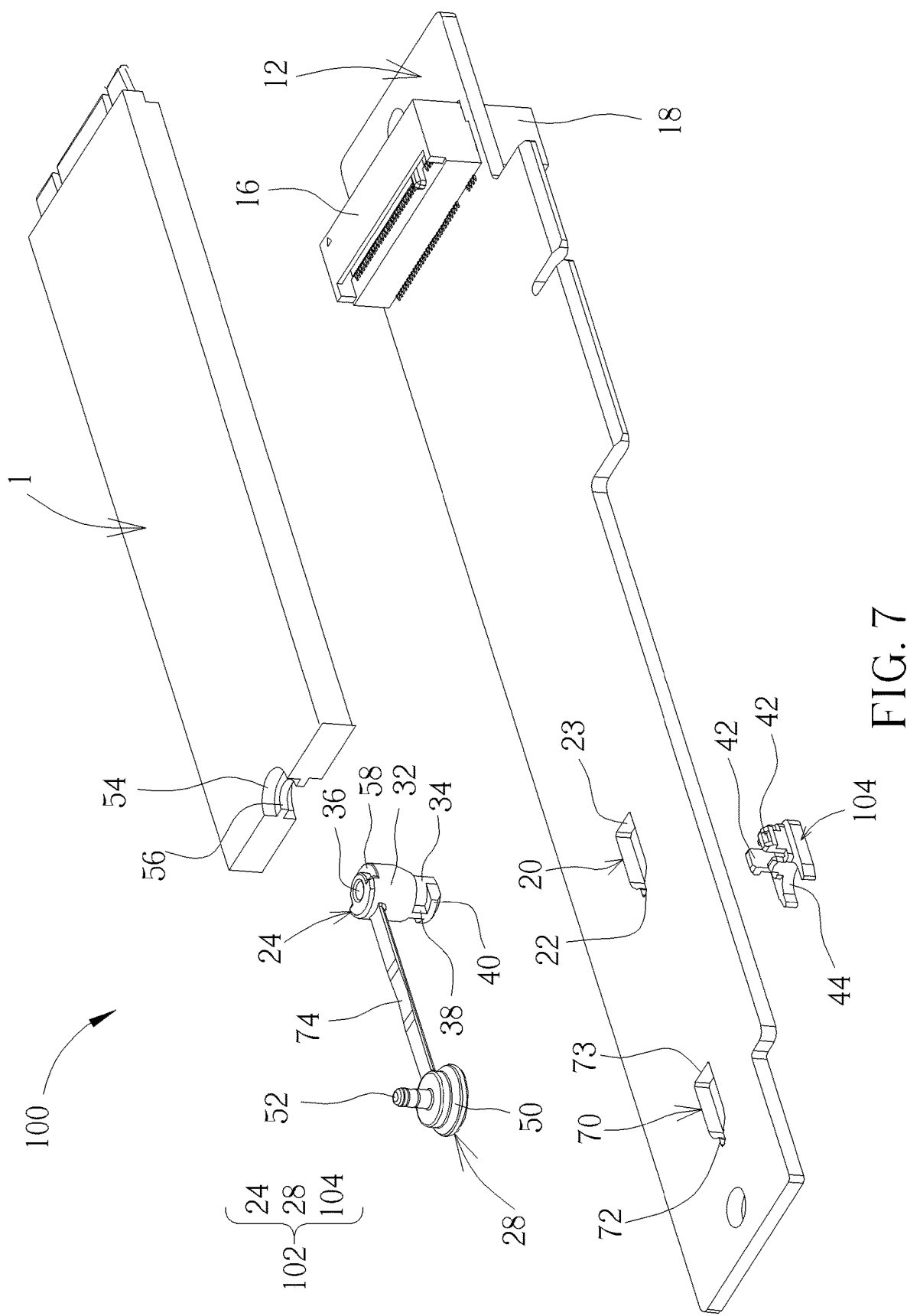
FIG. 7 is an exploded diagram of the circuit board device in FIG. 6.
Figure 8:
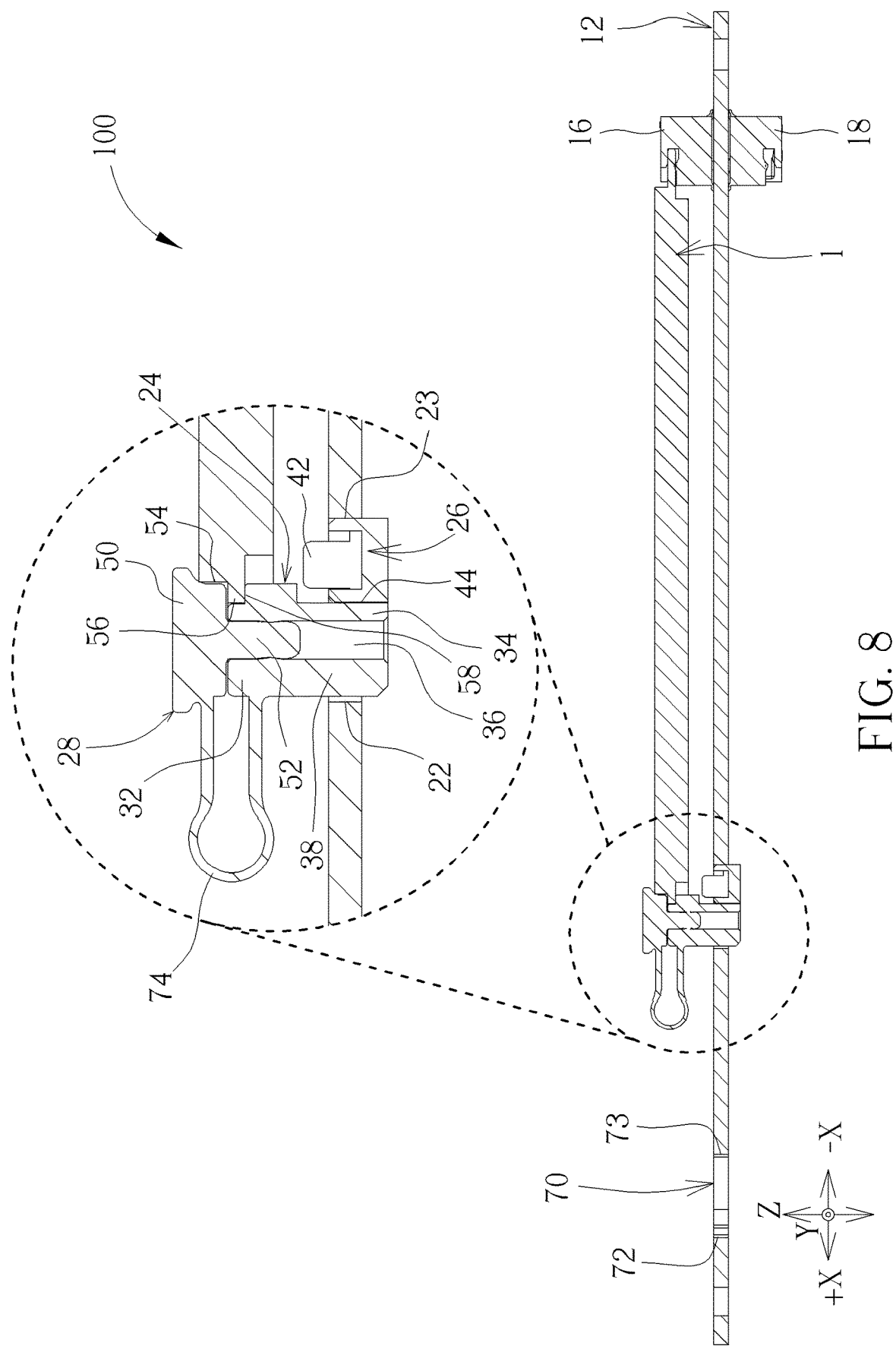
FIG. 8 is a cross-sectional diagram of the circuit board device in FIG. 6 along a cross-sectional line B-B.

It should be mentioned that the second pillar body 46 could be an omissible component for simplifying the fixing design of the present disclosure. For example, please refer to FIG. 6, FIG. 7, and FIG. 8. FIG. 6 is an assembly diagram of a circuit board device 100 according to another embodiment of the present disclosure. FIG. 7 is an exploded diagram of the circuit board device 100 in FIG. 6. FIG. 8 is a cross-sectional diagram of the circuit board device 100 in FIG. 6 along a cross-sectional line B-B. Components both mentioned in this embodiment and the aforesaid embodiments represent components with similar structures or functions, and the related description is omitted herein. As shown in FIGS. 6-8, the circuit board device 100 includes the circuit board 12 and a fixing member 102. The fixing member 102 includes the pillar structure 24, abase 104, and the first fixing component 28. The base 104 has at least one second positioning portion 42 (two hooks shown in FIG. 7, but the present disclosure is not limited thereto) and the opening 44.

Via the aforesaid design, when the positioning pillar 34 is disposed in the first hole 20 and the first positioning portion 38 is engaged with the first positioning end portion 22, the circuit board 12 is sandwiched between the clamping portion 40 and the first pillar body 32. On the other hand, when the second positioning portion 42 is engaged with the second positioning end portion 23 of the first hole 20 and the opening 44 is engaged with the positioning pillar 34, the base 104 is disposed in the first hole 20 and abuts against the positioning pillar 34. In such a manner, via the designs that the first positioning portion 38 is engaged with the first positioning end portion 22 and the circuit board 12 is sandwiched between the clamping portion 40 and the first pillar body 32, the fixing member 102 can constrain movement of the pillar structure 24 toward the +X-axis direction, the ±Y-axis directions, and the ±Z-axis directions. Furthermore, via the design that the second positioning portion 42 is engaged with the second positioning end portion 23 and the base 104 abuts against the positioning pillar 34, the fixing member 102 can constrain movement of the pillar structure 24 toward the −X-axis direction. As such, the three-axis positioning effect can be achieved, so as to make the pillar structure 24 fixed in the first hole 20 firmly for the subsequent interface card clamping operation.

After the pillar structure 24 is fixed in the first hole 20, the fixing member 102 can utilize the first fixing component 28 to be detachably inserted into the first axial hole 36 for clamping the first interface card 1 cooperatively with the first pillar body 32 when the first interface card 1 is inserted into the first socket 16, so as to complete the operation of mounting one single interface card on the circuit board 12 (as shown in FIG. 6). As for the related description for the operations of detaching the first interface card 1 from the circuit board 12 and mounting the fixing member 102 into another hole for mounting of another interface card having a different mounting length (e.g., mounting the fixing member 102 into the second hole 70 for clamping the second interface card 2' which has a longer mounting length and is inserted into the first socket 16), it could be reasoned by analogy according to the aforementioned embodiments and omitted herein.

In summary, since the present disclosure omits the second pillar body to prevent the fixing member from additionally occupying space under the circuit board in this embodiment, the prior art problem that the circuit board and another circuit board cannot be disposed in a stacked arrangement since the plastic hook pillar additionally occupies space under the circuit board can be solved. Thus, the present disclosure can greatly improve flexibility of the circuit board in the mounting configuration and space utilization.

Figure 9:
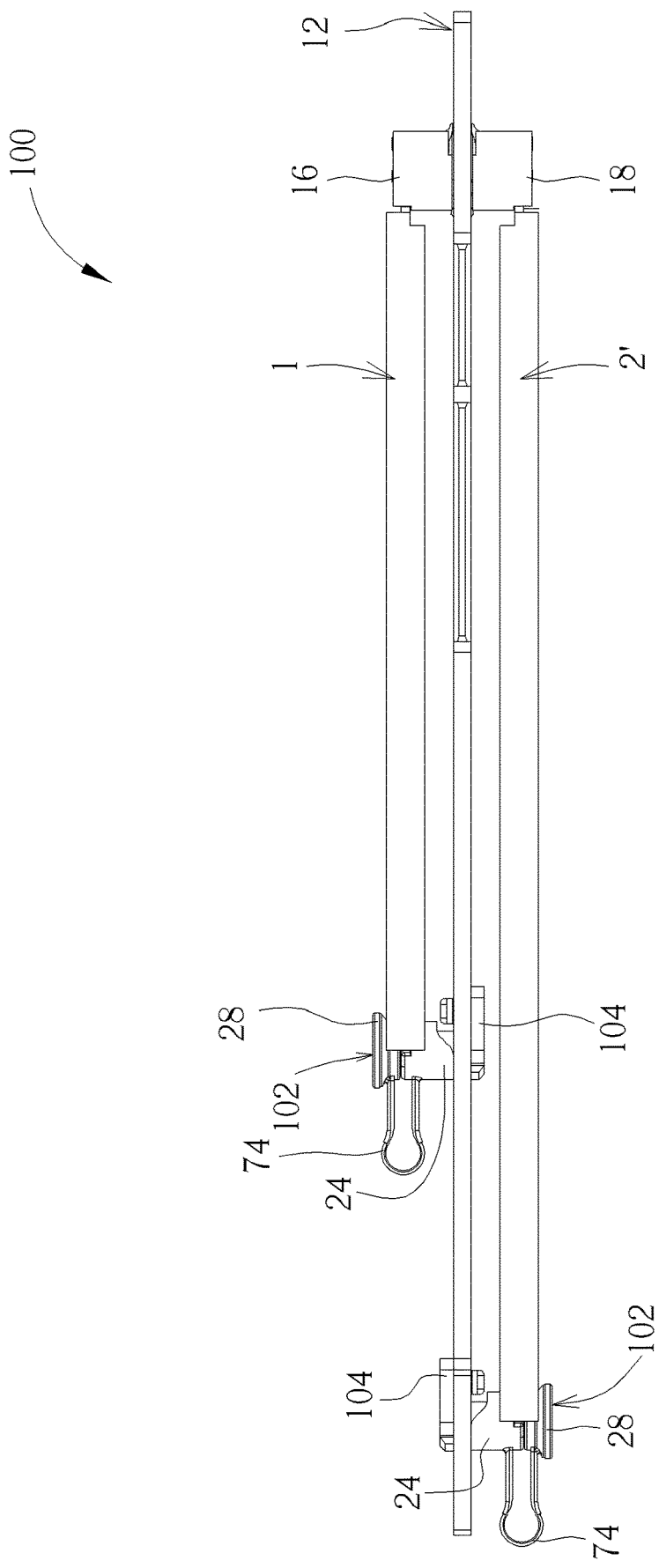
FIG. 9 is a side view of the circuit board device in FIG. 6 having a first interface card and a second interface card mounted thereon.

Moreover, the fixing member 102 could be suitable for mounting interface cards having different mounting lengths on the circuit board 12. For example, please refer to FIG. 6, FIG. 7, FIG. 8, and FIG. 9. FIG. 9 is a side view of the circuit board device 100 in FIG. 6 having the first interface card 1 and the second interface card 2' mounted thereon. As shown in FIGS. 6-9, if the user wants to additionally mount the second interface card 2' on the circuit board 12, the user just needs to mount another fixing member 102 into the second hole 70. Subsequently, the user can insert the second interface card 2' into the second socket 18 and insert the first fixing component 28 into the first axial hole 38 for clamping the second interface card 2' cooperatively with the first pillar body 32. In such a manner, the user can complete the operation of mounting the first interface card 1 having the shorter mounting length (i.e., the first mounting length L1) and the second interface card 2' having the longer mounting length (i.e., the second mounting length L2) on the upper side and the bottom side of the circuit board 12 respectively (as shown in FIG. 9). As for other derived operations of the circuit board device 100 (e.g., mounting the first interface card 1' having the longer mounting length and the second interface card 2 having the shorter mounting length on the upper side and the bottom side of the circuit board 12 respectively), the related description could be reasoned by analogy according to the aforesaid embodiments and omitted herein.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A circuit board device suitable for mounting of a first interface card, the circuit board device comprising:
   a circuit board having a first socket for connection of the first interface card and having a first hole, the first hole having a first position end portion and a second positioning end portion; and
   a fixing member comprising:
      a pillar structure having a first pillar body, a positioning pillar, and a first axial hole formed on the pillar structure, the positioning pillar extending downward from the first pillar body and having a first positioning portion and a clamping portion corresponding to the first positioning end portion, the clamping portion clamping the circuit board cooperatively with the first pillar body when the positioning pillar is disposed in the first hole and the first positioning portion is engaged with the first positioning end portion;
      a base having at least one second positioning portion and an opening, the base being disposed in the first hole and abutting against the positioning pillar to make the pillar structure fixed in the first hole when the second positioning portion is engaged with the second positioning end portion of the first hole and the opening is engaged with the positioning pillar; and
      a first fixing component detachably inserted into the first axial hole to clamp the first interface card cooperatively with the first pillar body.

2. The circuit board device of claim 1, wherein the first positioning end portion is one of a protruding rib and a notch, the first positioning portion is the other of the protruding rib and the notch, and the second positioning portion is a hook.

3. The circuit board device of claim 1, wherein the first fixing component has a head portion and a pin, the first interface card has a notch corresponding to the fixing member, an arc-shaped convex portion protruding from the notch toward the first pillar body, the first pillar body has an arc-shaped concave portion formed thereon corresponding to the arc-shaped convex portion, and when the first interface card is inserted into the first socket and the pin is inserted into the first axial hole, the arc-shaped concave portion is fitted with the arc-shaped convex portion and the arc-shaped convex portion is sandwiched by the head portion and the first pillar body.

4. The circuit board device of claim 1, wherein the fixing member further comprises:
   a connection strip connected to the first fixing component and the first pillar body.

5. The circuit board device of claim 1, wherein the second positioning end portion is a square hoe edge or a circular hole edge.

6. The circuit board device of claim 1, wherein the circuit board further has a second hole, and the second hole has a third positioning end portion and a fourth positioning end portion; when the positioning pillar is disposed in the second hole and the first positioning portion is engaged with the third positioning end portion, the clamping portion clamps the circuit board cooperatively with the first pillar body; when the second positioning portion is engaged with the fourth positioning end portion and the opening is engaged with the positioning pillar, the base is disposed in the second hole and abuts against the positioning pillar to make the pillar structure fixed in the second hole; when a second interface card is inserted into the first socket and the first fixing component is inserted into the first axial hole, the first fixing component clamps the second interface card cooperatively with the first pillar body.

7. The circuit board device of claim 6, wherein the first interface card has a first mounting length relative to the circuit board when the first interface card is inserted into the first socket, the second interface card has a second mounting length relative to the circuit board when the second interface card is inserted into the first socket, and the second mounting length is larger than the first mounting length.

8. The circuit board device of claim 1, wherein the circuit board further has a second socket disposed at a side of the circuit board opposite to the first socket, the fixing member further comprises a second fixing component, a second pillar body extends downward from the base and has a second axial hole, and the second fixing component is inserted into the second axial hole to clamp the second interface card cooperatively with the second pillar body when a second interface card is inserted into the second socket.

9. The circuit board device of claim 8, wherein the second fixing component has a head portion and a pin, the second interface card has a notch corresponding to the fixing member, an arc-shaped convex portion protruding from the notch toward the second pillar body, the second pillar body has an arc-shaped concave portion formed thereon corresponding to the arc-shaped convex portion, and when the second interface card is inserted into the second socket and the pin is inserted into the second axial hole, the arc-shaped concave portion is fitted with the arc-shaped convex portion and the arc-shaped convex portion is sandwiched by the head portion and the second pillar body.

10. The circuit board device of claim 8, wherein the first axial hole is aligned with the second axial hole axially.

11. The circuit board device of claim 8, wherein the fixing member further comprises two connection strips, one of the two connection strips is connected to the first fixing component and the first pillar body, and the other of the two connection strips is connected to the second fixing component and the second pillar body.

12. A fixing member suitable for being mounted on a circuit board to fix a first interface card, the circuit board having a first socket for connection of the first interface card and having a first hole, the first hole having a first position end portion and a second positioning end portion, the fixing member comprising:
   a pillar structure having a first pillar body, a positioning pillar, and a first axial hole formed on the pillar structure, the positioning pillar extending downward from the first pillar body and having a first positioning portion and a clamping portion corresponding to the first positioning end portion, the clamping portion clamping the circuit board cooperatively with the first pillar body when the positioning pillar is disposed in the first hole and the first positioning portion is engaged with the first positioning end portion;
   a base having at least one second positioning portion and an opening, the base being disposed in the first hole and abutting against the positioning pillar to make the pillar structure fixed in the first hole when the second positioning portion is engaged with the second positioning end portion of the first hole and the opening is engaged with the positioning pillar; and
   a first fixing component detachably inserted into the first axial hole to clamp the first interface card cooperatively with the first pillar body.

13. The fixing member of claim 12, wherein the first positioning end portion is one of a protruding rib and a notch, the first positioning portion is the other of the protruding rib and the notch, and the second positioning portion is a hook.

14. The fixing member of claim 12, wherein the first fixing component has a head portion and a pin, the first interface card has a notch corresponding to the fixing member, an arc-shaped convex portion protruding from the notch toward the first pillar body, the first pillar body has an arc-shaped concave portion formed thereon corresponding to the arc-shaped convex portion, and when the first interface card is inserted into the first socket and the pin is inserted into the first axial hole, the arc-shaped concave portion is fitted with the arc-shaped convex portion and the arc-shaped convex portion is sandwiched by the head portion and the first pillar body.

15. The fixing member of claim 12, wherein the fixing member further comprises:
   a connection strip connected to the first fixing component and the first pillar body.

16. The fixing member of claim 12, wherein the circuit board further has a second hole, and the second hole has a third positioning end portion and a fourth positioning end portion; when the positioning pillar is disposed in the second hole and the first positioning portion is engaged with the third positioning end portion, the clamping portion clamps the circuit board cooperatively with the first pillar body; when the second positioning portion is engaged with the fourth positioning end portion and the opening is engaged with the positioning pillar, the base is disposed in the second hole and abuts against the positioning pillar to make the pillar structure fixed in the second hole; when a second interface card is inserted into the first socket and the first fixing component is inserted into the first axial hole, the first fixing component clamps the second interface card cooperatively with the first pillar body.

17. The fixing member of claim 12, wherein the circuit board further has a second socket disposed at a side of the circuit board opposite to the first socket, the fixing member further comprises a second fixing component, a second pillar body extends downward from the base and has a second axial hole, and the second fixing component is inserted into the second axial hole to clamp the second interface card cooperatively with the second pillar body when a second interface card is inserted into the second socket.

18. The fixing member of claim 17, wherein the second fixing component has a head portion and a pin, the second interface card has a notch corresponding to the fixing member, an arc-shaped convex portion protruding from the notch toward the second pillar body, the second pillar body has an arc-shaped concave portion formed thereon corresponding to the arc-shaped convex portion, and when the second interface card is inserted into the second socket and the pin is inserted into the second axial hole, the arc-shaped concave portion is fitted with the arc-shaped convex portion and the arc-shaped convex portion is sandwiched by the head portion and the second pillar body.

19. The fixing member of claim 17, wherein the first axial hole is aligned with the second axial hole axially.

20. The fixing member of claim 17, wherein the fixing member further comprises two connection strips, one of the two connection strips is connected to the first fixing component and the first pillar body, and the other of the two connection strips is connected to the second fixing component and the second pillar body.

\* \* \* \* \*